(12) United States Patent
Chen et al.

(10) Patent No.: US 10,074,403 B2
(45) Date of Patent: *Sep. 11, 2018

(54) TOOL-LESS STORAGE DEVICE ADAPTOR TRAY WITH SLIDER MECHANISM

(71) Applicant: SUPER MICRO COMPUTER, INC., San Jose, CA (US)

(72) Inventors: Richard Chen, San Jose, CA (US); Lawrence H. Liang, San Jose, CA (US); Che-ming Yang, Palo Alto, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 14/802,961

(22) Filed: Jul. 17, 2015

(65) Prior Publication Data

US 2017/0018293 A1    Jan. 19, 2017

(51) Int. Cl.
*H05K 7/00* (2006.01)
*G11B 33/02* (2006.01)
*G06F 1/18* (2006.01)
*H05K 7/14* (2006.01)

(52) U.S. Cl.
CPC ............ *G11B 33/022* (2013.01); *G06F 1/187* (2013.01); *H05K 7/1417* (2013.01)

(58) Field of Classification Search
CPC ....... G11B 33/022; G11B 33/00; G06F 1/656; G06F 1/187; H05K 7/1417

USPC ................ 361/679.33, 679.35, 679.38, 825; 248/298.1

See application file for complete search history.

(56) References Cited

U.S. PATENT DOCUMENTS

| | | | | |
|---|---|---|---|---|
| 6,141,222 A * | 10/2000 | Toor | ........................ | G06F 1/184 312/223.1 |
| 6,172,870 B1 * | 1/2001 | Novotny | ................. | G06F 1/187 361/679.37 |
| 6,236,563 B1 * | 5/2001 | Buican | .................... | G06F 1/184 312/333 |
| 7,204,469 B2 * | 4/2007 | Chen | ........................ | G06F 1/187 248/694 |
| 8,094,446 B2 * | 1/2012 | Liu | ...................... | G11B 33/124 361/679.33 |
| 8,320,118 B2 * | 11/2012 | Chuang | ................ | G11B 33/124 211/26 |
| 8,644,017 B2 * | 2/2014 | Dunham | ................. | G06F 1/183 361/679.33 |
| 9,648,775 B2 * | 5/2017 | Chen | .................... | H05K 7/1417 |
| 2005/0066346 A1 * | 3/2005 | Wang | .................. | H05K 7/1489 720/657 |

(Continued)

*Primary Examiner* — Todd Michael Epps
(74) *Attorney, Agent, or Firm* — Artegis Law Group, LLP

(57) ABSTRACT

A storage device tray has a form factor designed to support a larger storage device, and is configured to secure a small storage device, thereby acting as an adapter between storage device sizes. The storage device tray includes a sliding mechanism configured with pegs that may couple to screw holes in the storage device. The sliding mechanism also exerts a force against the storage device to secure that storage device, and may be locked to further secure that storage device. At least one advantage of this approach is that a storage device can be coupled to a storage device tray without using screws.

20 Claims, 12 Drawing Sheets

(56) References Cited

U.S. PATENT DOCUMENTS

| | | | | |
|---|---|---|---|---|
| 2006/0007650 A1* | 1/2006 | Shim | ................ | G06F 1/184 |
| | | | | 361/679.33 |
| 2007/0070595 A1* | 3/2007 | Chen | ................ | G06F 1/187 |
| | | | | 361/679.37 |
| 2007/0236878 A1* | 10/2007 | Lin | ................ | G06F 1/184 |
| | | | | 361/679.33 |

* cited by examiner

TOOL-LESS STORAGE DEVICE ADAPTOR TRAY WITH SLIDER MECHANISM

BACKGROUND OF THE INVENTION

Field of the Invention

Embodiments of the present invention relate generally to storage device trays, and, more specifically, to a tool-less storage device adapter tray.

Description of the Related Art

A conventional mass storage device may be a hard disk drive (HDD) or a solid-state drive (SSD). Storage devices such as HDDs and SSDs are typically manufactured with standardized 2.5-inch and 3.5-inch form factors. Such conventional storage devices can be coupled to a computing device via a storage device tray. The storage device is usually mounted to the tray using screws, and the tray is then mounted within the computing device.

Conventional storage device trays are typically designed with a large form factor that is capable of housing 3.5-inch storage devices, and computing devices are generally designed to accept storage device trays having this larger form factor. The larger form factor storage device tray not only provides sufficient space for 3.5-inch storage devices, the design also provides sufficient space to house the smaller 2.5-inch storage devices. A 2.5-inch storage device can be mounted within the larger form factor storage device tray using mounting brackets and four small screws. The mounting brackets can be coupled within the storage device tray and provide a stable mounting point. The screws are inserted through screw holes in the mounting brackets, and then tightened into a sink in the storage device to secure the device within. Thus, a larger form factor storage device tray may act as an adapter between a 2.5-inch storage device and a computing device that accepts storage device trays designed to accommodate 3.5-inch storage devices.

One drawback associated with traditional adapter trays is that, as described above, mounting the 2.5-inch storage device within the tray requires a number of small screws in order to securely fasten the storage device. Mounting the storage device using these small screws is tedious and time-consuming and also prone to error. These issues are compounded with larger server machine implementations where tens or hundreds of 2.5-inch storage devices may be deployed.

As the foregoing illustrates, what is needed in the art is a technique for mounting a storage device having a small form factor within a storage device tray designed with a larger form factor.

SUMMARY OF THE INVENTION

One embodiment of the present invention sets forth a storage device tray, including a sideplate, a baseplate, and a sliding mechanism coupled to the baseplate and configured to exert a force against a storage device to secure the storage device against the sideplate.

At least one advantage of the disclosed approach is that a storage device can be coupled to a storage device tray without using screws. Further, the storage device can be securely mounted to the device tray much faster than is possible with conventional approaches that require numerous screws to be tightened

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
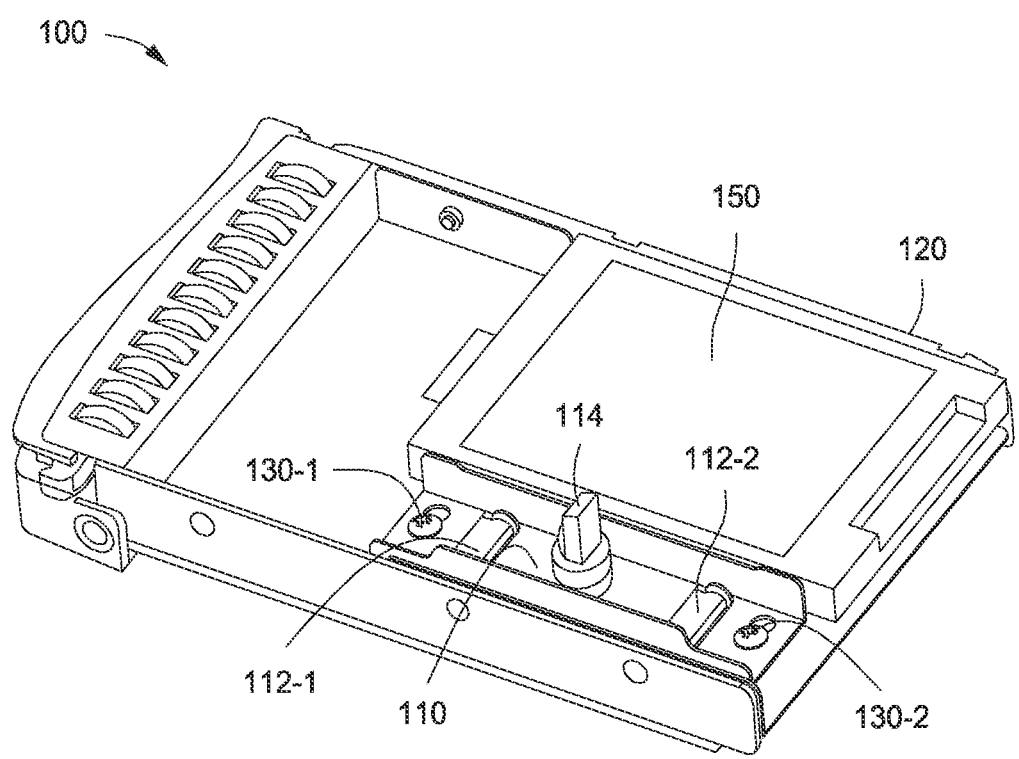
FIG. 1 is a conceptual illustration of a storage device tray configured to securely house a small storage device, according to one embodiment of the present invention.

FIG. 1 is a conceptual illustration of a storage device tray configured to securely house a small storage device, according to one embodiment of the present invention. As shown, storage device tray 100 includes a sliding mechanism 110, a sideplate 120, and a set of screws 130-1 and 130-2. Sliding mechanism 110 includes a set of springs 112-1 and 112-2 and a locking mechanism 114. Sliding mechanism 110 is configured to securely mount a storage device 150 within storage device tray 100.

In operation, sliding mechanism 110 is configured to slide laterally within storage device tray 100, either towards sideplate 120 or away from sideplate 120. Springs 112-1 and 112-2 exert a force between storage device tray 100 and sliding mechanism 110, which causes sliding mechanism 110 to travel towards sideplate 120. When storage device 150 is placed within storage device tray 100, sliding mechanism 110 exerts a corresponding force against storage device 150, thereby securing storage device 150 against sideplate 120. Sliding mechanism 110 may also be locked, thereby preventing lateral travel, when a user toggles locking mechanism 114, as shown in FIG. 2.

Figure 2:
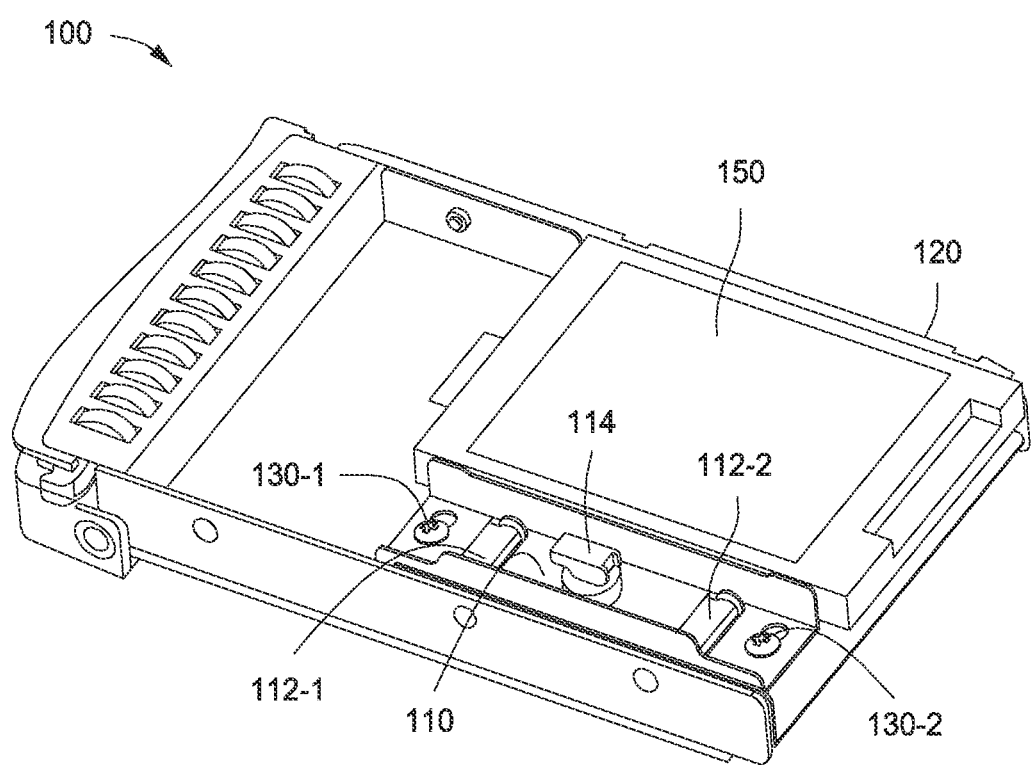
FIG. 2 is a conceptual illustration of the storage device tray of FIG. 1 in a locked configuration, according to one embodiment of the present invention.

FIG. 2 is a conceptual illustration of the storage device tray of FIG. 1 in a locked configuration, according to one embodiment of the present invention. As shown, locking mechanism 114 is toggled to lock sliding mechanism 110 into a particular lateral position that secures storage device 150 against sideplate 120. The locking feature described herein advantageously reduces the risk that storage device 150 is accidentally uncoupled from storage device tray 100.

Referring generally to FIGS. 1-2, sliding mechanism 110 includes a set of pegs (not shown here) that may be introduced into a corresponding set of screw holes within storage device 150 to provide added stability. When sliding mechanism 110 exerts the force against storage device 150 to secure that storage device, these pegs may be firmly coupled to storage device 150. Sideplate 120 may also include a set of pegs (not shown) that may be introduced into a different set of screw holes on the opposite side of storage device 150, also providing added stability. The pegs described herein generally do not have screw threads, and may thus be referred to as being "threadless."

In one embodiment, storage device 150 may be a small (i.e. 2.5-inch) storage device, such as a 2.5-inch hard disk drive (HDD) or 2.5-inch solid-state drive (SSD). Although storage device tray 100 may be configured to mount a 2.5-inch storage device, storage device tray 100 may have an external form factor that is comparable to trays which house larger storage devices, such as 3.5-inch storage devices. Thus, storage device tray 100 acts as an adapter for converting between 2.5-inch and 3.5-inch form factors. Further, storage device tray 100, configured to mount storage device 150, may be interchanged with other storage device trays housing storage devices of other sizes.

Sliding mechanism 110 allows storage device 150 to be mounted to and removed from storage device tray 100 without the need for manipulating any screws, thereby providing a significant advantage over prior art approaches. In order to mount storage device 150 within storage device tray 100, a user ensures that locking mechanism 14 is not locked, and then pulls sliding mechanism 110 away from sideplate 120. When the exerted force overcomes the resistance of springs 112-1 and 112-2, sliding mechanism 110 may travel away from sideplate 120. The user may then position storage device 150 to insert the various threadless pegs associated with sliding mechanism 110 and sideplate 120 into the aforesaid screw holes of storage device 150.

Then, the user may release sliding mechanism 110. Springs 112-1 and 112-2 cause sliding mechanism 110 to travel towards storage device 150. Sliding mechanism 110 then exerts force against storage device 150, in response to springs 112-1 and 112-2, which secures the various threadless pegs within storage device 150. Locking mechanism 114 may then be toggled to a locked configuration, as shown in FIG. 2. In this configuration, storage device 150 may be securely mounted within storage device tray 100. To remove storage device 150 from storage device tray 110, the user need only toggle locking mechanism 114, pull sliding mechanism 110 away from sideplate 120, and remove storage device 150. Sliding mechanism 110 is described in greater detail below in conjunction with FIGS. 3-4.

Figure 3:
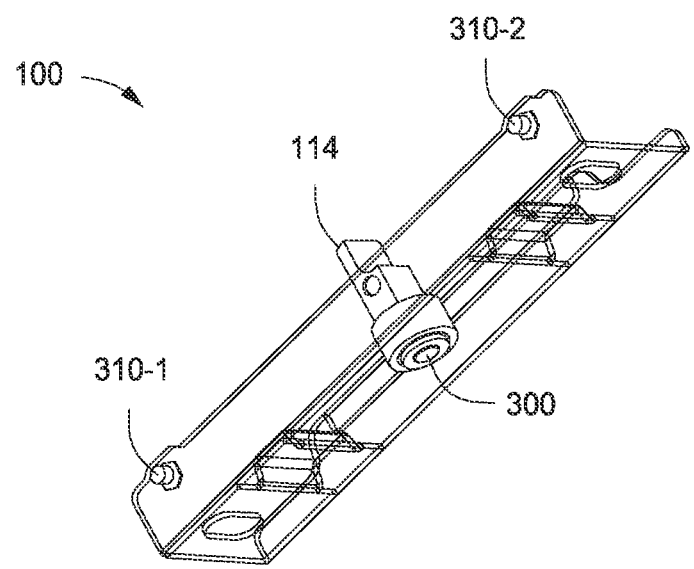
FIG. 3 is a conceptual illustrations of the sliding mechanism of FIGS. 1-2, according to one embodiment of the present invention.

FIG. 3 is a conceptual illustration of the sliding mechanism of FIGS. 1-2, according to one embodiment of the present invention. As shown, sliding mechanism 110 includes locking mechanism 114 that, in turn, includes a locking pin 300. Sliding mechanism 110 also includes pegs 310-1 and 310-2. Pegs 310-1 and 310-2 may be introduced into screw holes in storage device 150 in the fashion described above in conjunction with FIGS. 1-2. Locking mechanism 114 may be toggled to cause locking pin 300 to extend away from sliding mechanism 110, in the fashion shown in FIG. 4.

Figure 4:
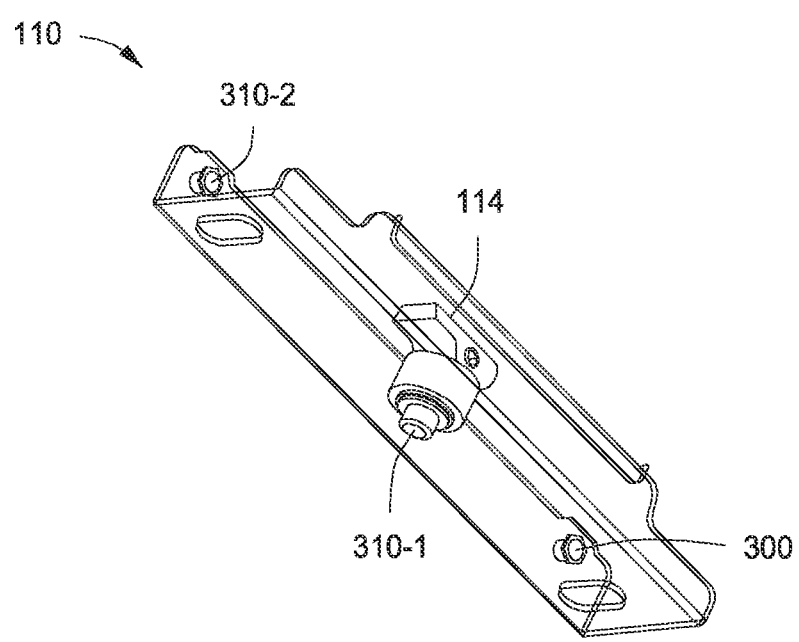
FIG. 4 is a conceptual illustration of the sliding mechanism of FIGS. 1-2 from a different perspective, according to one embodiment of the present invention.

FIG. 4 is a conceptual illustration of the sliding mechanism of FIGS. 1-2 from a different perspective, according to one embodiment of the present invention. As shown, locking pin 300 extends beyond the bottom of sliding mechanism 110 when locking mechanism 114 is toggled. In this configuration, locking pin 300 may be introduced through a hole in the underside of storage device tray 100, as shown in FIG. 5.

Figure 5:
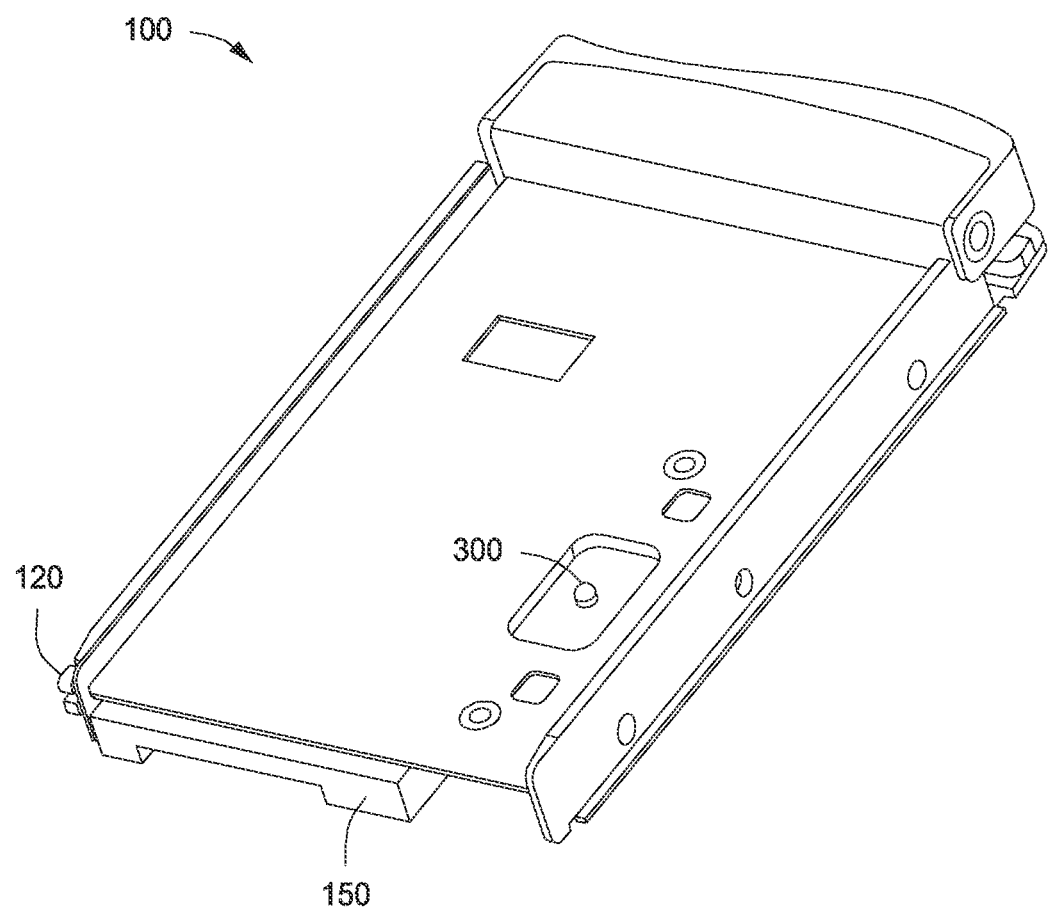
FIG. 5 is a conceptual illustration of the underside of the storage device tray of FIG. 1, according to one embodiment of the present invention.

FIG. 5 is a conceptual illustration of the underside of the storage device tray of FIG. 1, according to one embodiment of the present invention. As shown, locking pin 300 extends through the underside of storage device 100 through a small hole when locking mechanism 114 is locked. This configuration mechanically restricts the ability of sliding mechanism 110 to slide, thereby securing storage device 150 within storage device tray 100.

An advantage of storage device tray 100 is that storage devices having smaller form factors than 3.5-inches may be mounted within that storage device tray, and then mounted within computing devices configured to receive trays designed for the 3.5-inch form factor. Furthermore, storage device tray 100 provides an entirely tool-less approach to mounting a storage device to a tray, which obviates the need for tools as well as tool usage. Thus, a user can mount storage device 150 to storage device tray 100 using only their hands and without needing to fasten screws. An important outcome of this approach is that storage devices having a 2.5-inch form factor can be quickly mounted to trays and then coupled to computing devices, greatly expediting the swapping of storage devices. FIGS. 6-14 describe other embodiments of a storage device tray configured to mount a small storage device.

Figure 6:
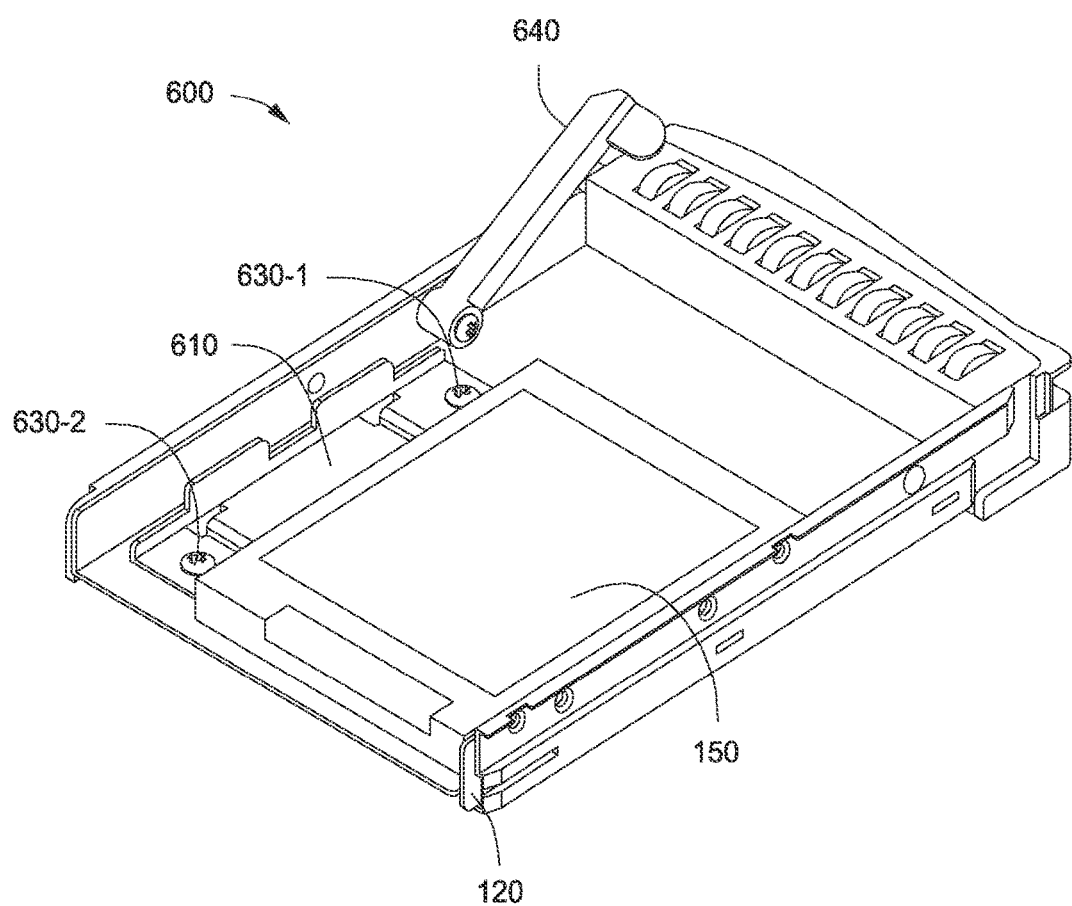
FIG. 6 is a conceptual illustration of a storage device tray configured to securely house a small storage device, according to another embodiment of the present invention.

FIG. 6 is a conceptual illustration of a storage device tray configured to securely house a small storage device, according to another embodiment of the present invention. As shown, a storage device tray 600 includes a sliding mechanism 610 that is coupled to storage device 600 via screws 630-1 and 630-2. Screws 630-1 and 630-2 allow sliding mechanism 610 to slide laterally towards and away from sideplate 120. Contrary to sliding mechanism 110 discussed above in conjunction with FIGS. 1-5, sliding mechanism 610 may not include springs in certain embodiments, and, thus, may slide freely. As also shown, storage device tray 600 includes a locking lever 640 that is configured to rotate towards sliding mechanism 610 in order to lock that sliding mechanism into place in a particular lateral position, as shown in FIG. 7.

Figure 7:
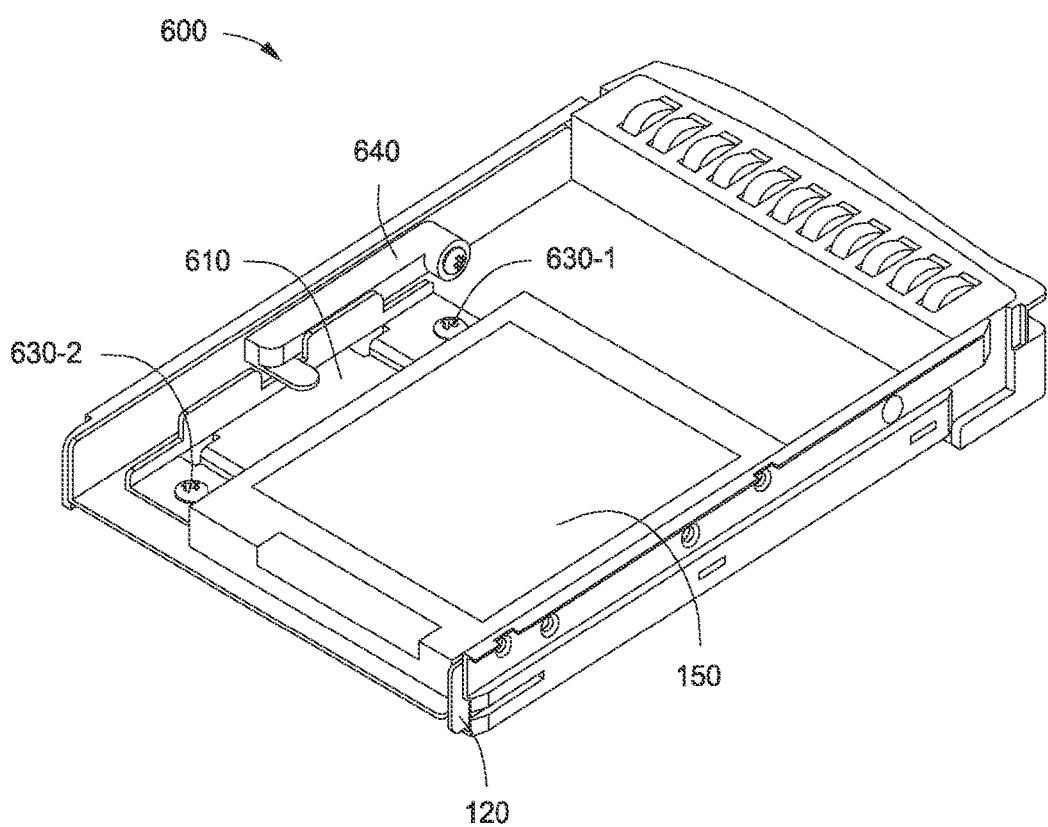
FIG. 7 is a conceptual illustration of the storage device tray of FIG. 6 in a locked configuration, according to one embodiment of the present invention.

FIG. 7 is a conceptual drawing illustrating the storage device tray of FIG. 6 in a locked configuration, according to one embodiment of the present invention. As shown, locking lever 640 has been rotated downwards and now occupies a space between sliding mechanism 610 and a wall of storage device tray 600. In this configuration, locking lever 640 forces sliding mechanism 120 against storage device 150, thereby securing that storage device against sideplate 120.

Figure 8:
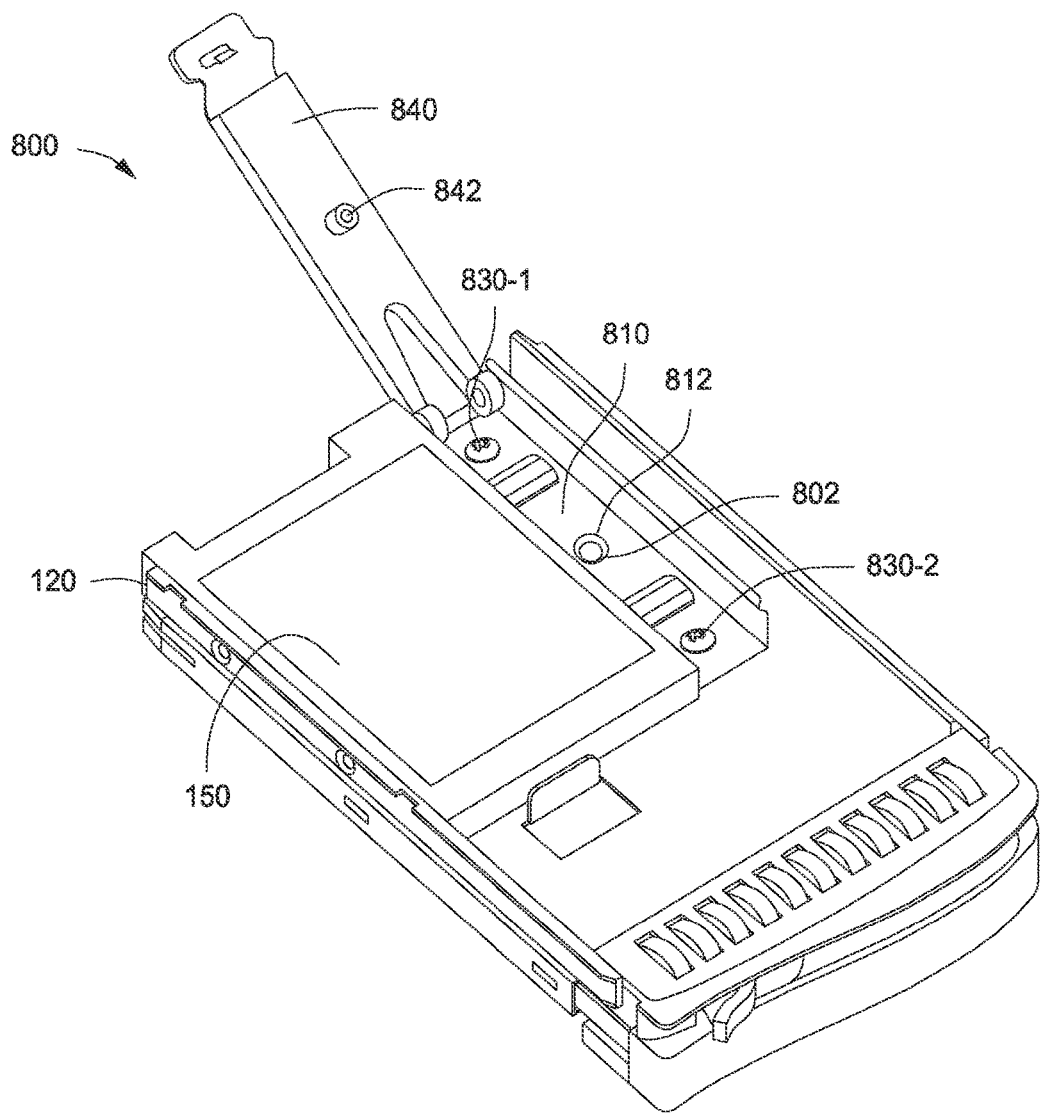
FIG. 8 is a conceptual illustration of a storage device tray configured to securely house a small storage device, according to yet another embodiment of the present invention.
Figure 9:
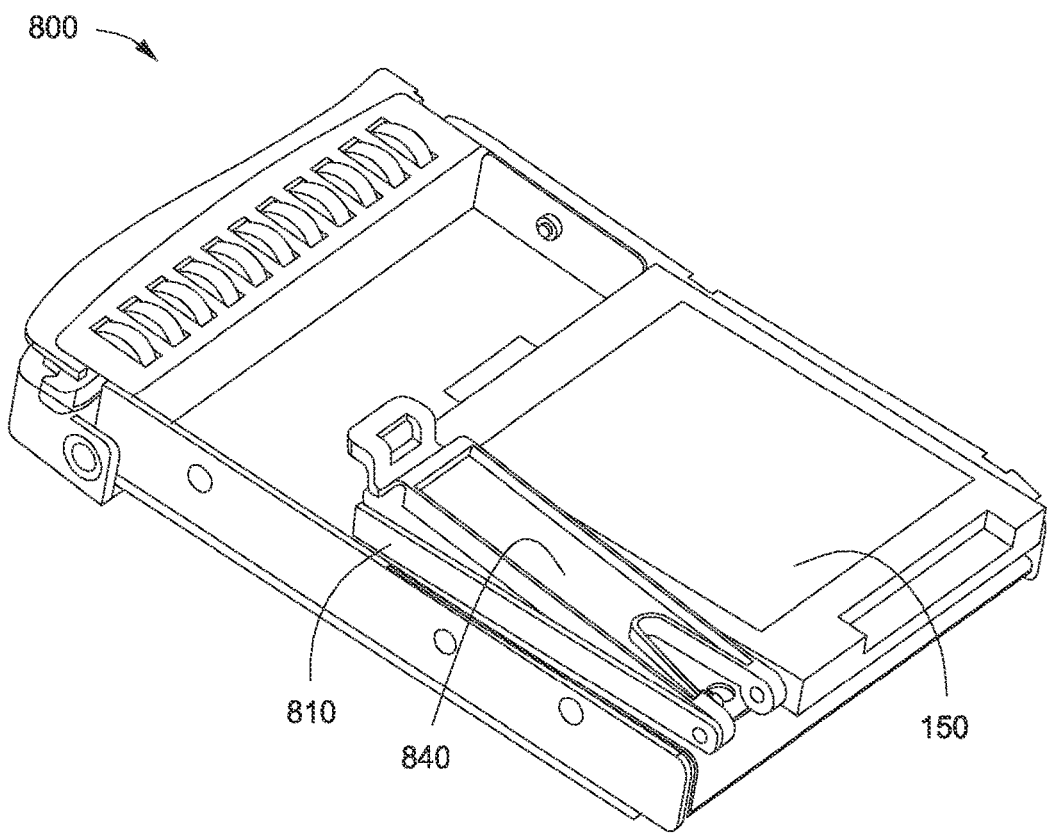
FIG. 9 is a conceptual illustration of the storage device tray of FIG. 8 in a locked configuration, according to one embodiment of the present invention.

In one embodiment, sliding mechanism 610 includes threadless pegs that may be introduced into corresponding screw holes in storage device 150. When sliding mechanism 610 is forced against storage device 150, the threadless pegs are introduced into the aforesaid screw holes. Sideplate 120 may also include threadless pegs configured to couple with screw holes on the opposite side of storage device 150. FIGS. 8-9 illustrate another type of storage device tray that includes a locking lever, as described in greater detail below.

FIG. 8 is a conceptual illustration of a storage device tray configured to securely house a small storage device, according to yet another embodiment of the present invention. As shown, a storage device tray 800 includes a sliding mechanism 810 that is coupled to storage device 800 via screws 830-1 and 830-2. Screws 830-1 and 830-2 allow sliding mechanism 610 to slide laterally towards and away from sideplate 120. In one embodiment, sliding mechanism 810 may include springs that force that sliding mechanism laterally towards sideplate 120. Sliding mechanism 810 also includes a hole 812 that may align with a corresponding hole 802 in the baseplate of storage device tray 800 when sliding mechanism 810 resides in certain lateral positions. In the configuration shown, sliding mechanism 810 resides at one mechanical limit imposed by screws 830-1 and 830-2 and/or storage device 150. In this position, hole 812 aligns with hole 802.

As also shown, storage device tray 800 includes a locking lever 840 that is configured to rotate towards sliding mechanism 810 in order to lock that sliding mechanism into place at the aforementioned mechanical limit. Locking lever 840 includes a peg 842 that may be introduced into holes 812 and 802 when those holes are aligned and locking lever 840 is closed, as shown in FIG. 9.

FIG. 9 is a conceptual illustration of the storage device tray of FIG. 8 in a locked configuration, according to one embodiment of the present invention. As shown, locking lever 840 has been rotated downwards and peg 842 has been introduced into holes 812 and 802 (not shown here). In this configuration, locking lever 840 forces sliding mechanism 120 against storage device 150, thereby securing that storage device against sideplate 120. Locking lever 840 is discussed in greater detail below in conjunction with FIG. 10.

Figure 10:
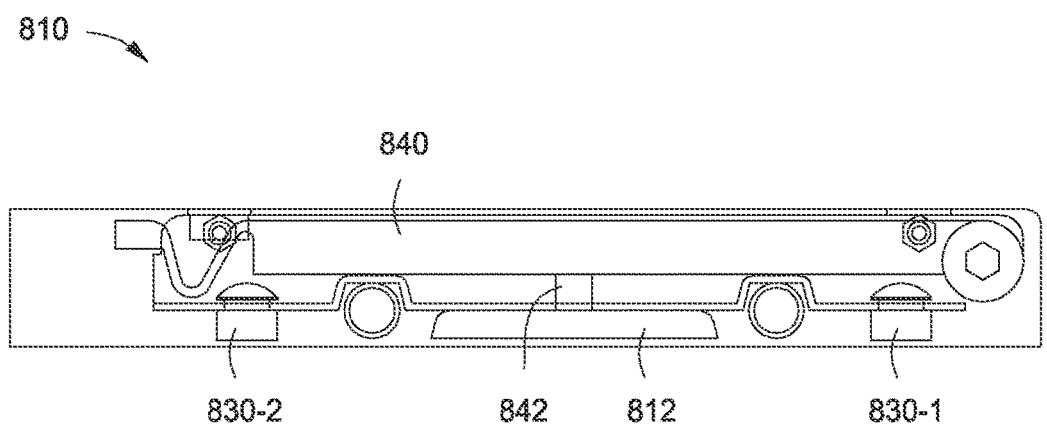
FIG. 10 is a conceptual illustration of the locking lever of FIGS. 8-9 in greater detail, according to one embodiment of the present invention.

FIG. 10 is a conceptual illustration of the locking lever of FIGS. 8-9 in greater detail, according to one embodiment of the present invention. As shown, sliding mechanism 810 includes locking lever 840 disposed in a closed configuration. When closed, peg 842 inserts through holes 812 and 802, as also shown in FIG. 11.

Figure 11:
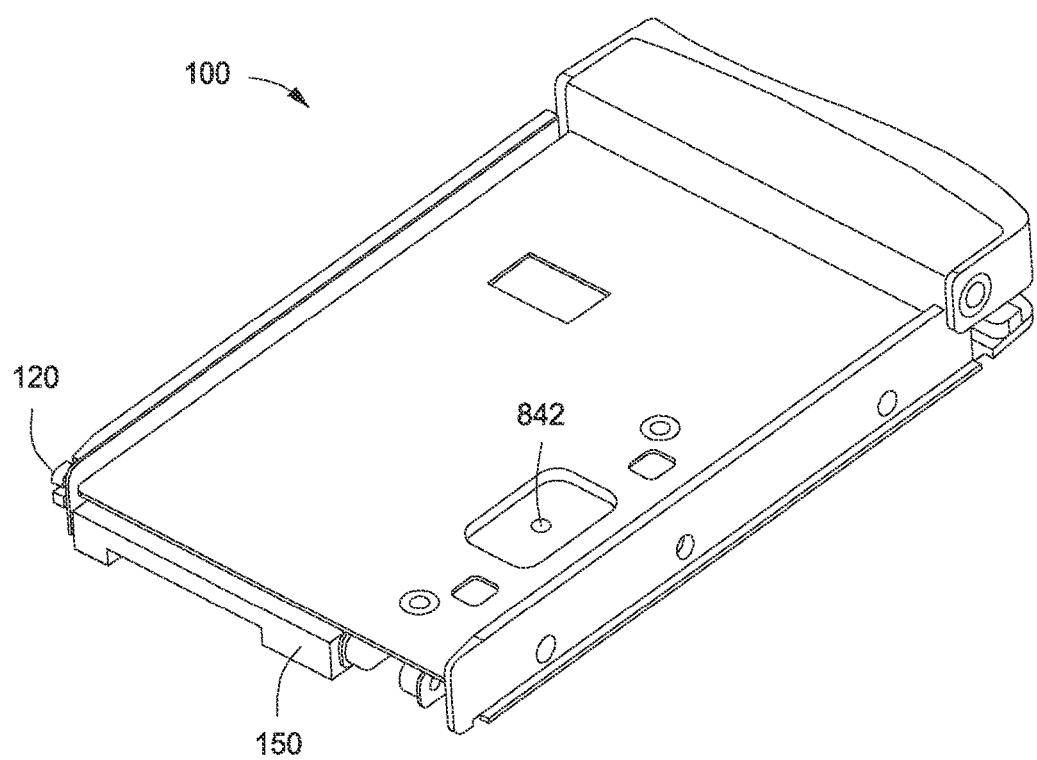
FIG. 11 is a conceptual illustration of the underside of the storage device tray of FIG. 8-9, according to one embodiment of the present invention.

FIG. 11 is a conceptual illustration of the underside of the storage device tray of FIG. 8-9, according to one embodiment of the present invention. As shown, peg 842 is configured to protrude from hole 802 when locking lever 840 resides in a locked configuration.

Figure 12:
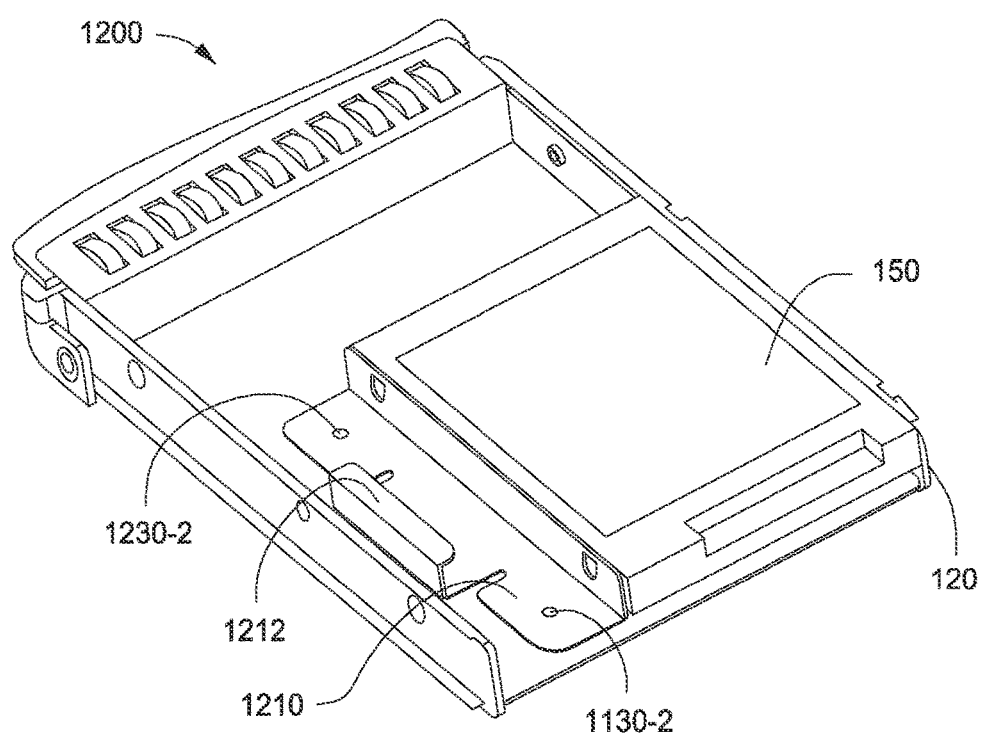
FIG. 12 is a conceptual illustration of a storage device tray configured to securely house a small storage device, according to yet another embodiment of the present invention.
Figure 13:
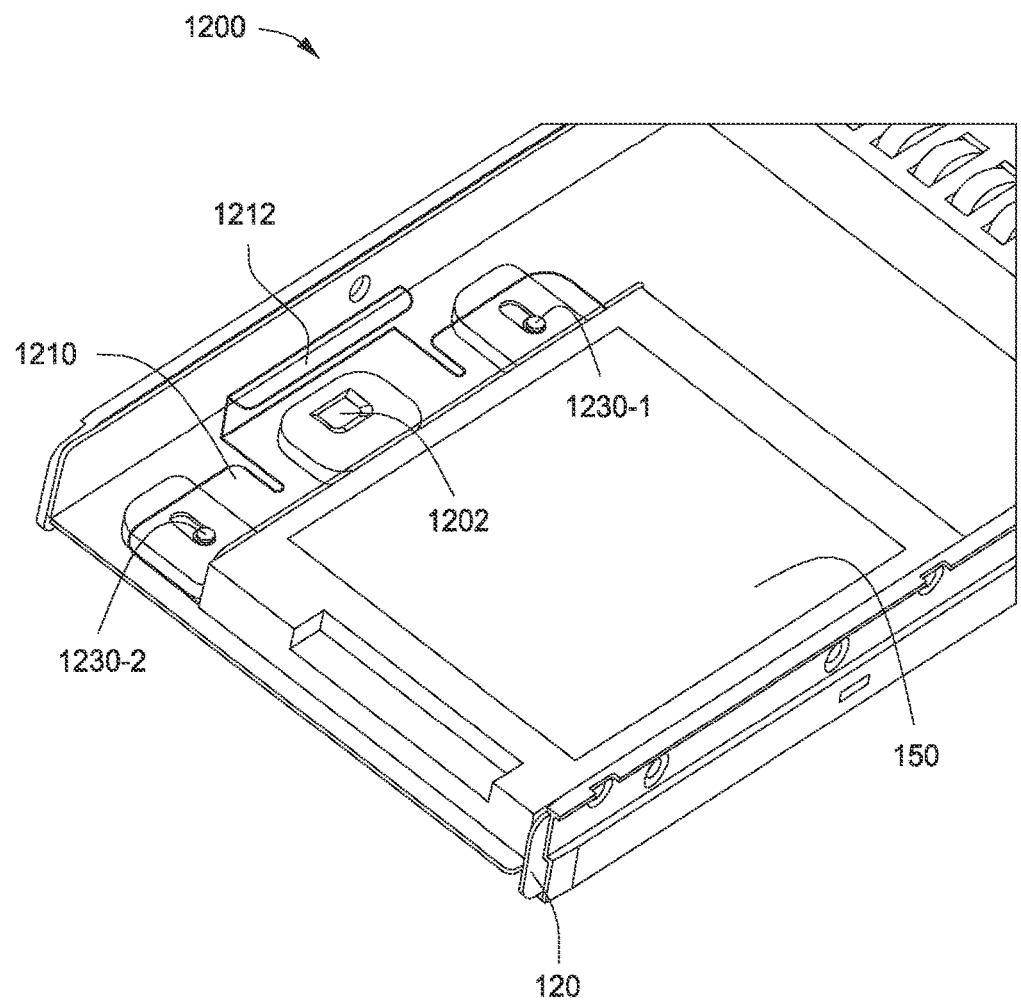
FIG. 13 is a conceptual illustration of the locking mechanism of FIG. 12, according to one embodiment of the present invention.
Figure 14:
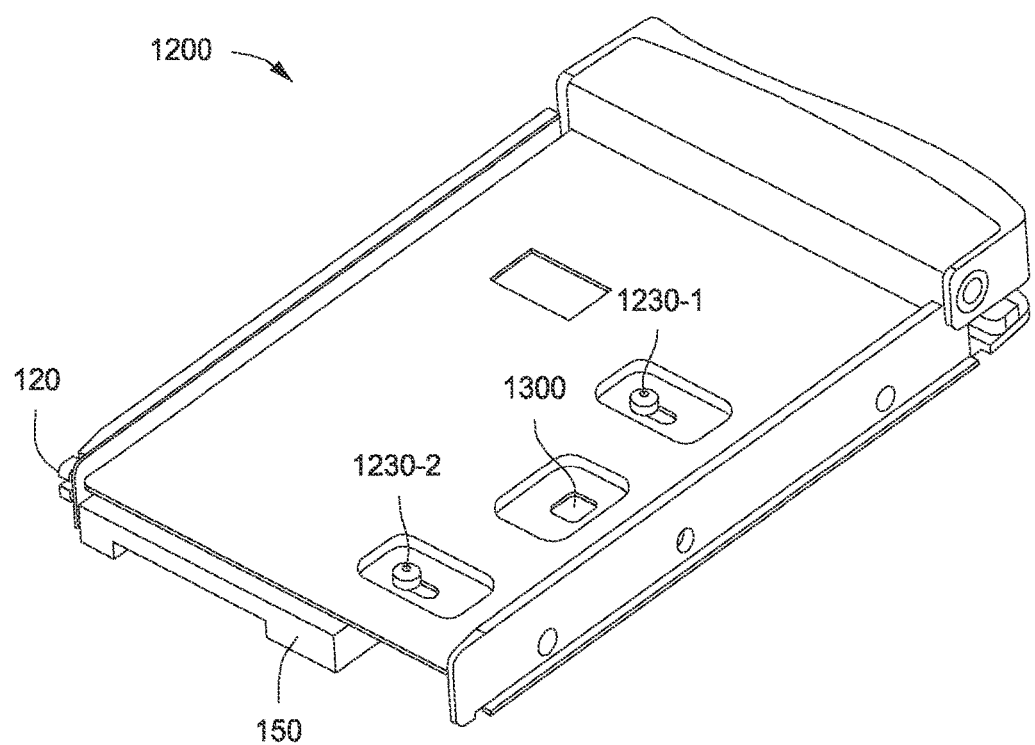
FIG. 14 is a conceptual illustration of the underside of the storage device tray of FIGS. 12-13, according to one embodiment of the present invention.

Referring generally to FIGS. 8-11, in one embodiment, sliding mechanism 810 includes threadless pegs that may be introduced into corresponding screw holes in storage device 150. When sliding mechanism 810 is forced against storage device 150, the threadless pegs are introduced into the aforesaid screw holes. FIGS. 12-14 illustrate yet another type of locking mechanism that involves a locking lever, as described in greater detail below.

FIG. 12 is a conceptual illustration of a storage device tray configured to securely house a small storage device, according to yet another embodiment of the present invention. As shown, storage device tray 1200 includes a sliding mechanism 1210 that is coupled to storage device tray 1200 via screws 1230-1 and 1230-2. Screws 1230-1 and 1230-2 allow sliding mechanism 1210 to slide laterally towards and away from storage device 150 and sideplate 120. Sliding mechanism 1210 also includes a handle 1212 that may be manipulated to reposition sliding mechanism 1210 and to lock a locking mechanism associated with that sliding mechanism, as described in greater detail below in conjunction with FIG. 13.

FIG. 13 is a conceptual illustration of the locking mechanism of FIG. 12, according to one embodiment of the present invention. As shown, sliding mechanism 1210 includes a locking mechanism 1300. Locking mechanism 1300 is a tab that protrudes from sliding mechanism 1210 and may be introduced into a hole in the baseplate of storage device 1200.

In operation, the user may lift sliding mechanism 1210 upwards, using handle 1212, and then slide sliding mechanism 1210 towards storage device 150. At the mechanical limit imposed by screws 1230-1 and 1230-2 and/or storage device 150, locking mechanism 1300 may be introduced into the aforesaid hole. When configured as such, sliding mechanism 1210 is secured at a particular lateral position and therefore forces storage device 150 against sideplate 120. In one embodiment, sliding mechanism 1210 includes threadless pegs that may be introduced into corresponding screw holes in storage device 150. When sliding mechanism 1210 is forced against storage device 150, the threadless pegs are introduced into the aforesaid screw holes. In order to release sliding mechanism 1210, the user lifts handle 1212, thereby removing locking mechanism 1300 from the hole, and then slides sliding mechanism 1210 away from storage device 150.

FIG. 14 is a conceptual illustration of the underside of the storage device tray of FIGS. 12-13, according to one embodiment of the present invention. As shown, locking mechanism 1300 protrudes through a hole in the baseplate of storage device tray 150 when sliding mechanism 1210 resides in the locked configuration. An advantage of sliding mechanism 1210 described in conjunction with FIGS. 12-14 is that sliding mechanism 1210 is mechanically simpler than some of the other sliding mechanisms described herein, and may thus be cheaper to manufacture.

In sum, a storage device tray has a form factor designed to support a larger storage device, and is configured to secure a small storage device, thereby acting as an adapter between storage device sizes. The storage device tray includes a sliding mechanism configured with pegs that may couple to screw holes in the storage device. The sliding mechanism also exerts a force against the storage device to secure that storage device, and may be locked to further secure that storage device.

At least one advantage of the disclosed approach is that a storage device can be coupled to a storage device tray without using screws. Further, the storage device can be securely mounted to the tray much faster than possible with conventional approaches that require numerous screws to be tightened. By implementing the techniques described herein, a computing device can be configured and re-configured with storage devices of different sizes.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

The invention claimed is:

1. A storage device tray, comprising:
    a sideplate;
    a baseplate; and
    a sliding mechanism comprising a first spring that slides the sliding mechanism laterally relative to the sideplate and exerts a force against a storage device to secure the storage device.

2. The storage device tray of claim 1, wherein the sliding mechanism includes a first threadless peg configured to be introduced into a first screw hole within the storage device when the sliding mechanism exerts the force against the storage device.

3. The storage device tray of claim 1, wherein the sideplate includes a second threadless peg configured to be introduced into a second screw hole within the storage device when the sliding mechanism exerts the force against the storage device.

4. The storage device tray of claim 1, wherein the first spring is configured to exert a substantially linear force between the sliding mechanism and the storage device tray to cause the sliding mechanism to exert the force against the storage device.

5. The storage device tray of claim 4, wherein the sliding mechanism further comprises a second spring that is configured to exert a substantially linear force between the sliding mechanism and the storage device tray to cause the sliding mechanism to exert the force against the storage device.

6. The storage device tray of claim 1, wherein the sliding mechanism includes a locking mechanism configured to restrict lateral travel of the sliding mechanism upon being locked.

7. The storage device tray of claim 6, wherein the locking mechanism comprises a lever that, when closed, forces the sliding mechanism towards the storage device to exert the force against the storage device.

8. The storage device tray of claim 6, wherein the locking mechanism comprises a lever that, when closed, is configured to lock the sliding mechanism by introducing a peg protruding from the lever through a first hole in the sliding mechanism and through a second hole in the baseplate.

9. The storage device tray of claim 6, wherein the locking mechanism comprises a tab protruding from the sliding mechanism and configured to lock the sliding mechanism when introduced through a hole in the baseplate.

10. The storage device tray of claim 1, wherein the storage device tray has a form factor capable of housing a 3.5-inch storage device, and wherein the storage device comprises a 2.5-inch storage device.

11. A sliding mechanism, comprising:
    a first surface coupled to a baseplate of a storage device tray;
    a second surface configured to exert a force against a storage device to secure the storage device against a sideplate of the storage device tray; and
    a first linear spring that slides the sliding mechanism laterally relative to the sideplate and exerts the force against the storage device.

12. The sliding mechanism of claim 11, wherein the second surface includes a first threadless peg configured to be introduced into a first screw hole within the storage device when the second surface exerts the force against the storage device.

13. The sliding mechanism of claim 11, wherein the sideplate includes a second threadless peg configured to be introduced into a second screw hole within the storage device when the second surface exerts the force against the storage device.

14. The sliding mechanism of claim 11, wherein the first linear spring is configured to exert a first linear force between the sliding mechanism and the storage device tray to cause the second surface to exert the force against the storage device.

15. The sliding mechanism of claim 14, further comprising a second linear spring configured to exert a second linear force between the sliding mechanism and the storage device tray to cause the second surface to exert the force against the storage device.

16. The sliding mechanism of claim 11, further comprising a locking mechanism configured to restrict lateral travel of the sliding mechanism upon being locked.

17. The sliding mechanism of claim 16, wherein the locking mechanism comprises a lever that, when closed, forces the sliding mechanism towards the storage device to exert the force against the storage device.

18. The sliding mechanism of claim 16, wherein the locking mechanism comprises a lever that, when closed, is configured to lock the sliding mechanism by introducing a peg protruding from the lever through a first hole in the sliding mechanism and through a second hole in the baseplate.

19. The sliding mechanism of claim 16, wherein the locking mechanism comprises a tab protruding from the sliding mechanism and configured to lock the sliding mechanism when introduced through a hole in the baseplate.

20. The sliding mechanism of claim 11, wherein the storage device tray has a form factor capable of housing a 3.5-inch storage device, and wherein the storage device comprises a 2.5-inch storage device.

* * * * *